(12) United States Patent
Kang et al.

(10) Patent No.: US 12,080,662 B2
(45) Date of Patent: Sep. 3, 2024

(54) DISPLAY DEVICE AND METHOD OF MANUFACTURING THE SAME

(71) Applicant: SAMSUNG DISPLAY CO., LTD., Yongin-si (KR)

(72) Inventors: Eui Jeong Kang, Suwon-si (KR); Sanghyeon Song, Suwon-si (KR); Heeju Woo, Tongyeong-si (KR); Donghyun Lee, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 289 days.

(21) Appl. No.: 17/316,716

(22) Filed: May 11, 2021

(65) Prior Publication Data

US 2021/0375804 A1 Dec. 2, 2021

(30) Foreign Application Priority Data

Jun. 1, 2020 (KR) .................. 10-2020-0065832

(51) Int. Cl.
*H01L 23/00* (2006.01)
*H10K 59/131* (2023.01)

(52) U.S. Cl.
CPC .............. *H01L 24/05* (2013.01); *H01L 24/02* (2013.01); *H01L 24/04* (2013.01); *H01L 24/29* (2013.01); *H01L 24/32* (2013.01); *H01L 24/33* (2013.01); *H01L 24/83* (2013.01); *H10K 59/131* (2023.02); *H01L 2224/02181* (2013.01); *H01L 2224/02185* (2013.01); *H01L 2224/04026* (2013.01); *H01L 2224/05073* (2013.01); *H01L 2224/05124* (2013.01); *H01L 2224/05139* (2013.01); *H01L 2224/05147* (2013.01); *H01L 2224/05166* (2013.01); *H01L 2224/0518* (2013.01); *H01L 2224/05551* (2013.01);
(Continued)

(58) Field of Classification Search
CPC .............. H01L 24/83; H01L 24/32–33; H01L 24/02–05
See application file for complete search history.

(56) References Cited

U.S. PATENT DOCUMENTS 6,538,323 B1 * 3/2003 Sakata .................... H01L 24/11
257/737
7,524,748 B2 4/2009 Fujimoto et al.
(Continued)

FOREIGN PATENT DOCUMENTS

JP 2018-129369 8/2018
JP 6523105 5/2019
(Continued)

*Primary Examiner* — Hoa B Trinh
(74) *Attorney, Agent, or Firm* — CANTOR COLBURN LLP

(57) ABSTRACT

The invention relates to display device and method of manufacturing the same. The display device includes: a substrate; a driving pad disposed on the substrate; an insulating layer exposing the driving pad and disposed on the substrate; a circuit board including a circuit pad overlapping the driving pad; and a connector disposed between the circuit board and the insulating layer and including a plurality of conductive particles electrically connecting the driving pad and the circuit pad, the driving pad including: a first pad disposed on the substrate; and a second pad disposed on the first pad and having an opening exposing the first pad.

13 Claims, 14 Drawing Sheets

(52) U.S. Cl.
CPC ............... *H01L 2224/05553* (2013.01); *H01L 2224/05564* (2013.01); *H01L 2224/05573* (2013.01); *H01L 2224/05686* (2013.01); *H01L 2224/0569* (2013.01); *H01L 2224/05693* (2013.01); *H01L 2224/29499* (2013.01); *H01L 2224/32227* (2013.01); *H01L 2224/32238* (2013.01); *H01L 2224/331* (2013.01); *H01L 2224/83048* (2013.01); *H01L 2224/83191* (2013.01); *H01L 2224/83192* (2013.01); *H01L 2224/83201* (2013.01); *H01L 2224/8322* (2013.01); *H01L 2224/83951* (2013.01)

(56) References Cited

U.S. PATENT DOCUMENTS

| | | | |
|---|---|---|---|
| 10,217,806 | B2 | 2/2019 | Kim et al. |
| 2013/0307130 | A1* | 11/2013 | Oga .................... H01L 23/3107 257/666 |
| 2019/0006265 | A1* | 1/2019 | Yamada ................. H01L 24/06 |
| 2019/0096979 | A1* | 3/2019 | Jo .......................... H10K 50/84 |

FOREIGN PATENT DOCUMENTS

| | | | |
|---|---|---|---|
| KR | 10-1057608 | | 8/2011 |
| KR | 10-2018-0000046 | | 1/2018 |
| KR | 10-1988903 | | 9/2019 |
| WO | WO-2014112541 A1 * | 7/2014 | ............. C08G 59/56 |

\* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2020-0065832, filed on Jun. 1, 2020, which is hereby incorporated by reference for all purposes as if fully set forth herein.

BACKGROUND

Field

The present invention relate generally to display devices and more specifically, to a display device having a circuit board and a method of manufacturing the display device.

Discussion of the Background

Various display devices, which are applied to multimedia devices, such as televisions, mobile phones, tablet computers, navigation units, and game units, have been developed.

The display devices include a display panel for displaying images. The display panel includes gate lines, data lines, and pixels connected to the gate lines and the data lines. The display panel is electrically connected to circuit boards and electronic components that provide electrical signals for displaying the images to the gate lines or the data lines.

The circuit boards and the electronic components are electrically connected to the display panel using a variety of methods. For instance, the circuit boards are electrically connected to the display panel with a conductive adhesive member disposed between pads of the circuit boards and pads of the display panel.

The above information disclosed in this Background section is only for understanding of the background of the inventive concepts, and, therefore, it may contain information that does not constitute prior art.

SUMMARY

Applicant discovered that defects such as a short circuit may occur between circuit pads or between driving pads of a display device.

Display devices constructed according to the principles and embodiments of the invention and methods of manufacturing the display devices have conductive particles aligned to circuit pads or driving pads to improve the efficiency of the process of bonding a pad of a display panel to a pad of a circuit board.

For example, a conductive adhesive member may be first bonded to a circuit board such that the conductive particles in the conductive adhesive member are aligned on the circuit pads. Accordingly, whether the conductive particles are aligned on the circuit pads may be easily checked. In addition, as the conductive particles aligned on the circuit pads are bonded to the driving pads of the display panel, the conductive particles are easily bonded to the driving pads.

Thus, the conductive particles do not overlap the space between the circuit pads or between the driving pads, and the likelihood of a short circuit between the circuit pads or between the driving pads may be reduced or prevented Additional features of the inventive concepts will be set forth in the description which follows, and in part will be apparent from the description, or may be learned by practice of the inventive concepts.

According to one aspect of the invention, a display device includes: a substrate; a driving pad disposed on the substrate; an insulating layer exposing the driving pad and disposed on the substrate; a circuit board including a circuit pad overlapping the driving pad; and a connector disposed between the circuit board and the insulating layer and including a plurality of conductive particles electrically connecting the driving pad and the circuit pad, the driving pad including: a first pad disposed on the substrate; and a second pad disposed on the first pad and having an opening exposing the first pad.

At least one of the plurality of conductive particles may be in contact with the first pad through the opening.

The connector may include a conductive adhesive member, and the plurality of conductive particles may include a solder.

The first pad and the second pad may include different materials.

The first pad may be formed of a metal, and the second pad may be formed of a transparent conductive layer.

The connector may include a conductive adhesive member including an adhesive layer having a bonding area overlapping the driving pad and a non-bonding area adjacent to the bonding area and not overlapping the driving pad.

The plurality of conductive particles may be disposed between the driving pad and the circuit pad.

The plurality of conductive particles may not overlap the non-bonding area.

The display device may further include a filling agent disposed between the adhesive layer and the circuit board.

The circuit board may further include a base layer supporting the circuit pad, and the circuit pad may include: a first circuit pad disposed on the base layer; and a second circuit pad covering the first circuit pad and disposed on the base layer.

The second circuit pad may have a thickness smaller than a thickness of the first circuit pad, and the plurality of conductive particles may be in contact with the second circuit pad.

The display device may further include an auxiliary insulating layer exposing the driving pad and being disposed on the insulating layer, wherein the adhesive layer may be disposed between the auxiliary insulating layer and the circuit board.

The display device may further include a filling agent disposed between the adhesive layer and the circuit board.

According to another aspect of the invention, a method of manufacturing a display device include the steps of: disposing a member including a plurality of conductive particles on a circuit pad of a circuit board; aligning the plurality of conductive particles to overlap the circuit pad by using affinity between the plurality of conductive particles and the circuit pad; disposing a driving pad of a display panel to face the plurality of conductive particles aligned on the circuit pad; and pressing the circuit board to electrically connect the circuit pad to the driving pad of the display panel through the plurality of conductive particles.

The method may further include the steps: filling a filling agent between the member and the circuit board; and curing the filling agent.

The affinity between the plurality of conductive particles and the circuit pad may include hydrophilicity.

The plurality of conductive particles may include a solder disposed between the driving pad and the circuit pad.

The member may include a conductive adhesive member, and the driving pad may include: a first pad; and a second pad disposed on the first pad and formed of a material different from a material of the first pad, the second pad having an opening exposing the first pad, wherein at least one of the plurality of conductive particles may be in contact with the first pad through the opening of the second pad.

According to another aspect of the invention, a method of manufacturing a display device includes the steps of: disposing a member including a plurality of conductive particles on a driving pad of a display panel; aligning the plurality of conductive particles to overlap the driving pad; disposing a circuit pad of a circuit board to face the plurality of conductive particles aligned on the driving pad of the display panel; and pressing the circuit board to electrically connect the circuit pad to the driving pad of the display panel through the plurality of conductive particles.

The plurality of conductive particles may be aligned to overlap the driving pad by an infrared laser.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
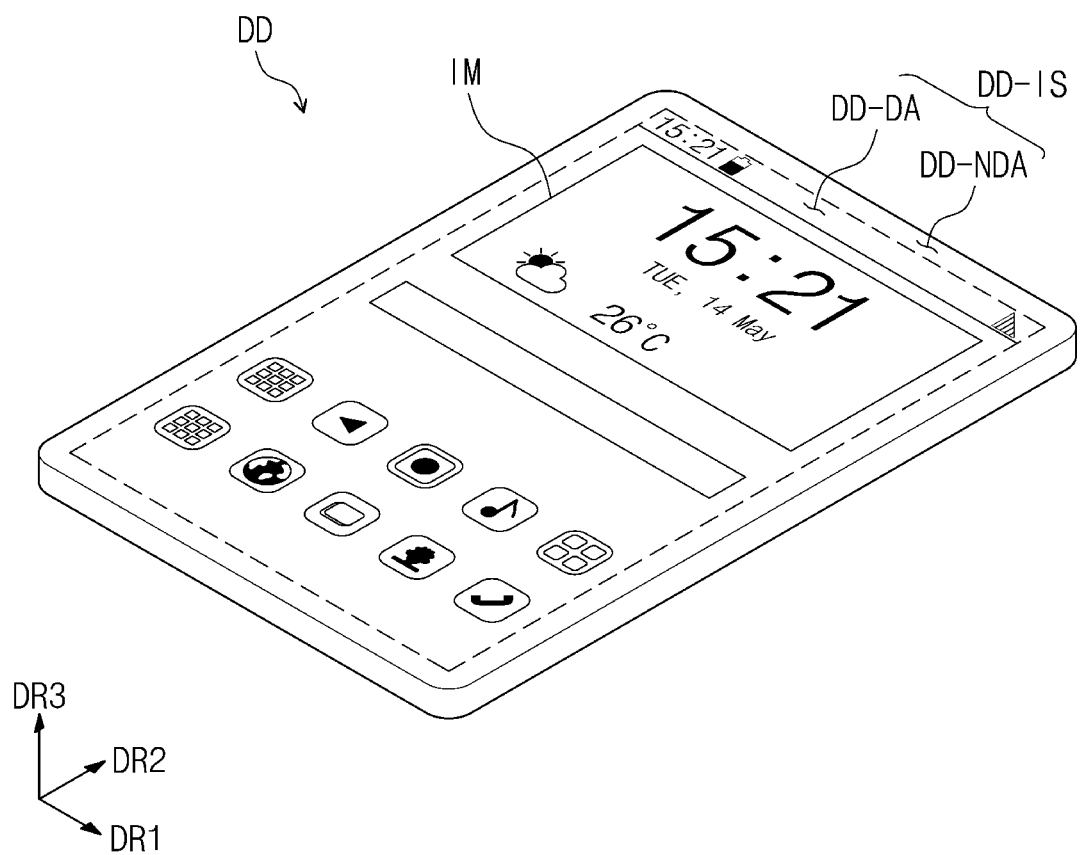
FIG. 1A is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first", "second", etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially", "about" and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be explained in detail with reference to the accompanying drawings.

Figure 1B:
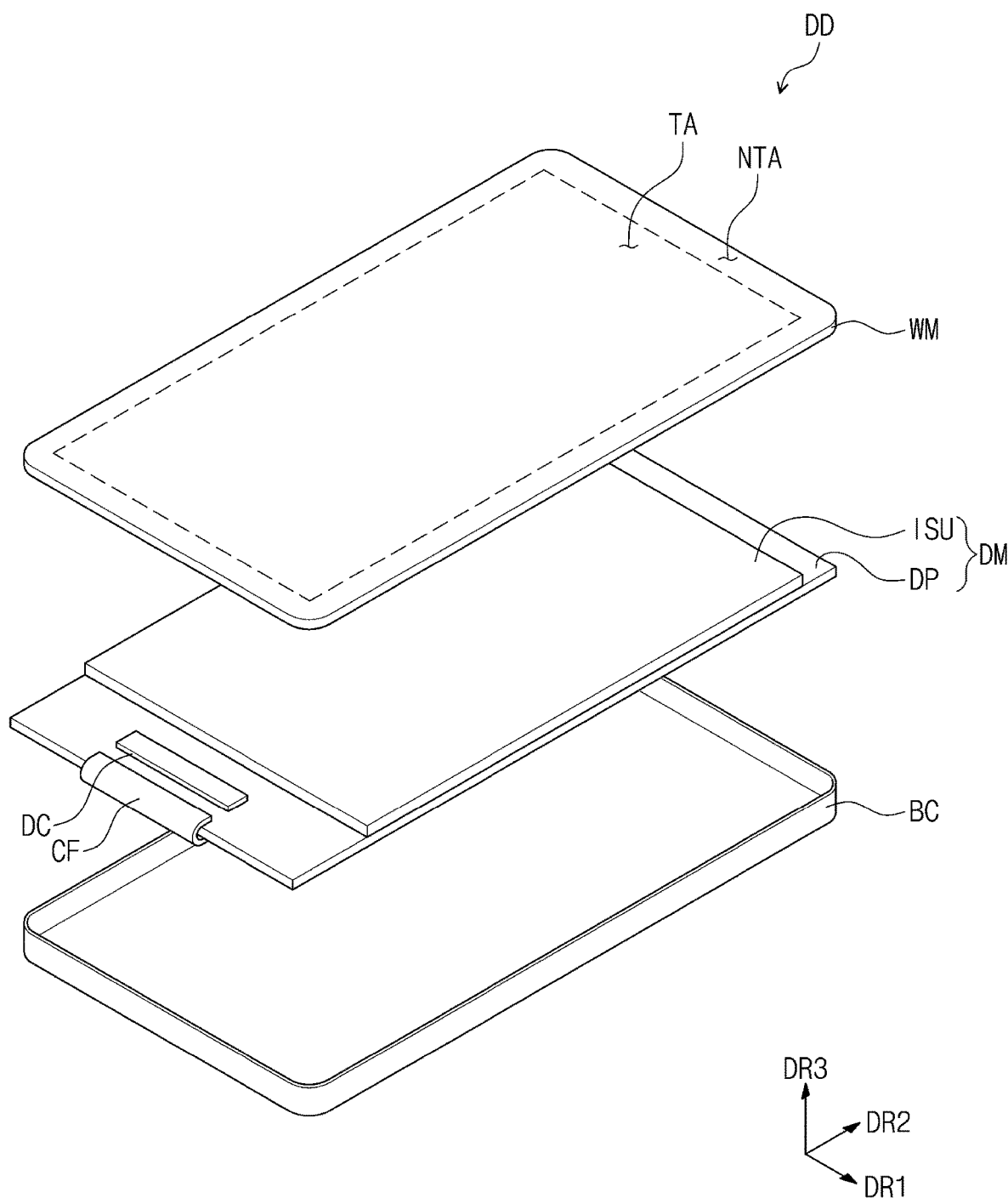
FIG. 1B is an exploded perspective view of the display device of FIG. 1A.
Figure 2:
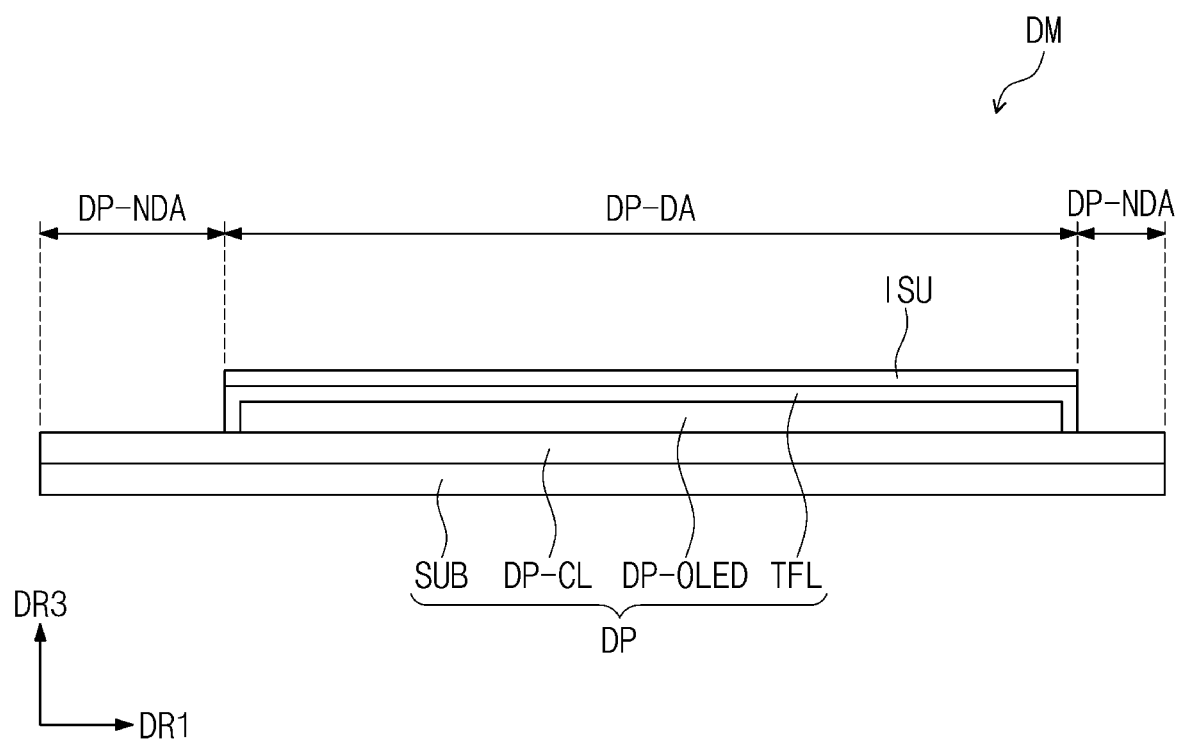
FIG. 2 is a cross-sectional view of the display module of the display device of FIG. 1B.

FIG. 1A is a perspective view of an embodiment of a display device DD constructed according to the principles of the invention. FIG. 1B is an exploded perspective view of the display device DD of FIG. 1A. FIG. 2 is a cross-sectional view of a display module DM of the display device DD of FIG. 1B.

In the embodiments, the display device DD is illustrated as being incorporated into a mobile phone as a representative example. Electronic modules mounted on a main board, a camera module, and a power supply module may be accommodated in a bracket or/and a case together with the display device DD, and thus the mobile phone may be formed. The display device DD may be applied into or take the form of other electronic devices including a large-sized electronic item, such as a television set and a monitor, and a small and medium-sized electronic item, such as a tablet computer, a car navigation unit, a game unit, and a smart watch.

Referring to FIG. 1A, the display device DD displays an image IM through a display surface DD-IS. FIG. 1A shows icon images as a representative example of the image IM. The display surface DD-IS is substantially parallel to a plane defined by a first direction DR1 and a second direction DR2. A third direction DR3 indicates a normal line direction of the display surface DD-IS, i.e., a thickness direction of the display device DD. In the following descriptions, an expression "when viewed in a plane", "in a plane", or "in plan view" means being viewed in the third direction DR3. Hereinafter, front (or upper) and rear (or lower) surfaces of each layer or each unit of the display device DD are distinct from each other by the third direction DR3. However, directions indicated by the first, second, and third directions DR1, DR2, and DR3 are relative to each other, and thus the directions indicated by the first, second, and third directions DR1, DR2, and DR3 may be changed to other directions, e.g., opposite directions.

In addition, the display surface DD-IS includes a display area DD-DA through which the image IM is displayed and a non-display area DD-NDA defined adjacent to the display area DD-DA. The image IM is not displayed through the non-display area DD-NDA, however, embodiments are not limited thereto or thereby. The non-display area DD-NDA may be adjacent to one side of the display area DD-DA or may be omitted.

Referring to FIG. 1B, the display device DD may include a window WM, a display module DM, a driving chip DC, a circuit board CF, and an housing BC. The housing BC may accommodate the display module DM and may be coupled to the window WM.

The window WM may be disposed on the display module DM and may transmit an image provided from the display module DM to the outside. The window WM may include a transmission area TA and a non-transmission area NTA. The transmission area TA may overlap the display area DD-DA and may have a shape corresponding to the display area DD-DA. The image IM displayed through the display area DD-DA of the display device DD may be viewed from the outside through the transmission area TA of the window WM.

The non-transmission area NTA may overlap the non-display area DD-NDA and may have a shape corresponding to the non-display area DD-NDA. The non-transmission area NTA may have a relatively low light transmittance compared with the transmission area TA. However, embodiments are not limited thereto or thereby, and the non-transmission area NTA may be omitted.

The window WM may include a glass, sapphire, or plastic material. The window WM may have a single-layer structure or a plurality of layers. The window WM may include a base layer and include at least one printed layer overlapping the non-transmission area NTA and disposed on a rear surface of the base layer. The printed layer may have a predetermined color. As an example, the printed layer may have a black color or may have other colors rather than the black color.

The display module DM is disposed between the window WM and the housing BC. The display module DM includes a display panel DP and an input sensing unit that may be in the form of input sensing layer ISU. The display panel DP generates the image and provides the generated image to the window WM.

The display panel DP according to the illustrated embodiment may be a light emission type display panel. However, embodiments are not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. In addition, the display panel DP has a rigidity. In another embodiment, the display panel DP may have flexibility to be folded with respect to a folding axis or curved along one direction.

Hereinafter, the organic light emitting display panel will be described as a representative example of the display panel DP. However, embodiments are not limited to the organic light emitting display panel, and various other types of display panels may be employed.

Referring to FIG. 2, the display panel DP includes the a substrate SUB, a circuit element layer DP-CL disposed on the substrate SUB, a display element layer DP-OLED disposed on the circuit element layer DP-CL, and an insulating layer TFL disposed on the display element layer DP-OLED.

The display panel DP includes a display area DP-DA and a non-display area DP-NDA. The display area DP-DA of the display panel DP corresponds to the display area DD-DA shown in FIG. 1A or the transmission area TA shown in FIG. 1B, and the non-display area DP-NDA of the display panel DP corresponds to the non-display area DD-NDA shown in FIG. 1A or the non-transmission area NTA shown in FIG. 1B.

The substrate SUB may include at least one plastic film. As an example, the substrate SUB may include a plastic substrate, a glass substrate, a metal substrate, or an organic/inorganic composite substrate as a flexible substrate. The substrate SUB may be a member that supports components of the display panel DP, and will be described as a display substrate in the following descriptions.

The circuit element layer DP-CL includes at least one insulating interlayer and a circuit element. The insulating interlayer includes at least one intermediate inorganic layer and/or at least one intermediate organic layer. The circuit element includes signal lines and a pixel driving circuit.

The display element layer DP-OLED includes a plurality of organic light emitting diodes. The display element layer DP-OLED further includes an organic layer such as a pixel definition layer. According to another embodiment, when the liquid crystal display panel is used as the display panel, the display element layer may be a liquid crystal layer.

The insulating layer TFL encapsulates the display element layer DP-OLED. As an example, the insulating layer TFL may be a thin film encapsulation layer. The insulating layer TFL protects the display element layer DP-OLED from moisture, oxygen, and a foreign substance such as dust particles. However, embodiments are not limited thereto or thereby. An encapsulation substrate may be used instead of the insulating layer TFL. In this case, the encapsulation substrate may face the substrate SUB, and the circuit element layer DP-CL and the display element layer DP-OLED may be disposed between the encapsulation substrate and the substrate SUB.

As shown in FIG. 2, the insulating layer TFL overlaps the display area DP-DA. However, embodiments are not limited thereto or thereby. For example, the insulating layer TFL may partially overlap the non-display area DP-NDA.

The input sensing layer ISU may be disposed between the window WM and the display panel DP. The input sensing layer ISU may sense an input applied from the outside. The input applied from the outside may be provided in various forms. For example, the external input may include various forms, such as a part of the user's body, a stylus pen, light, heat, or pressure. Also, in addition to an input by contacting a part of user's body, such as a user's hand, a proximity or approaching space touch (e.g., hovering) may be a form of the external input.

The input sensing layer ISU may be disposed directly on the display panel DP. The input sensing layer ISU may be formed together with the display panel DP through successive processes. However, embodiments are not limited thereto or thereby. The input sensing layer ISU may be coupled to the display panel DP by an adhesive layer after being provided as a separate panel. As another example, the input sensing layer ISU may be omitted.

Referring to FIG. 1B again, the driving chip DC may overlap the non-display area DP-NDA (see FIG. 2) and may be disposed on the display panel DP. For instance, the driving chip DC may generate driving signals for an operation of the display panel DP based on control signals provided from the circuit board CF. The driving chip DC may transmit the generated driving signals to the circuit element layer DP-CL of the display panel DP.

The circuit board CF is electrically connected to the display module DM. Referring to FIG. 1B, the circuit board CF is connected to the display panel DP. However, the circuit board CF may be electrically connected to each of the display panel DP and the input sensing layer ISU.

According to the embodiments, each of the circuit board CF and the driving chip DC may be electrically connected to the display panel DP through a connector that may be in the form of a conductive adhesive member. For instance, the conductive adhesive member may be disposed between the circuit board CF and the display panel DP, and the circuit board CF is electrically connected to the display panel DP through a plurality of conductive particles included in the conductive adhesive member.

In particular, a process of bonding the conductive adhesive member to one component of the circuit board CF and the display panel DP is performed, and then, a process of bonding the conductive adhesive member to the remaining component of the circuit board CF and the display panel DP is performed. The process of bonding the circuit board CF to the display panel DP using the conductive adhesive member will be described in detail with reference to FIG. 6.

Figure 3:
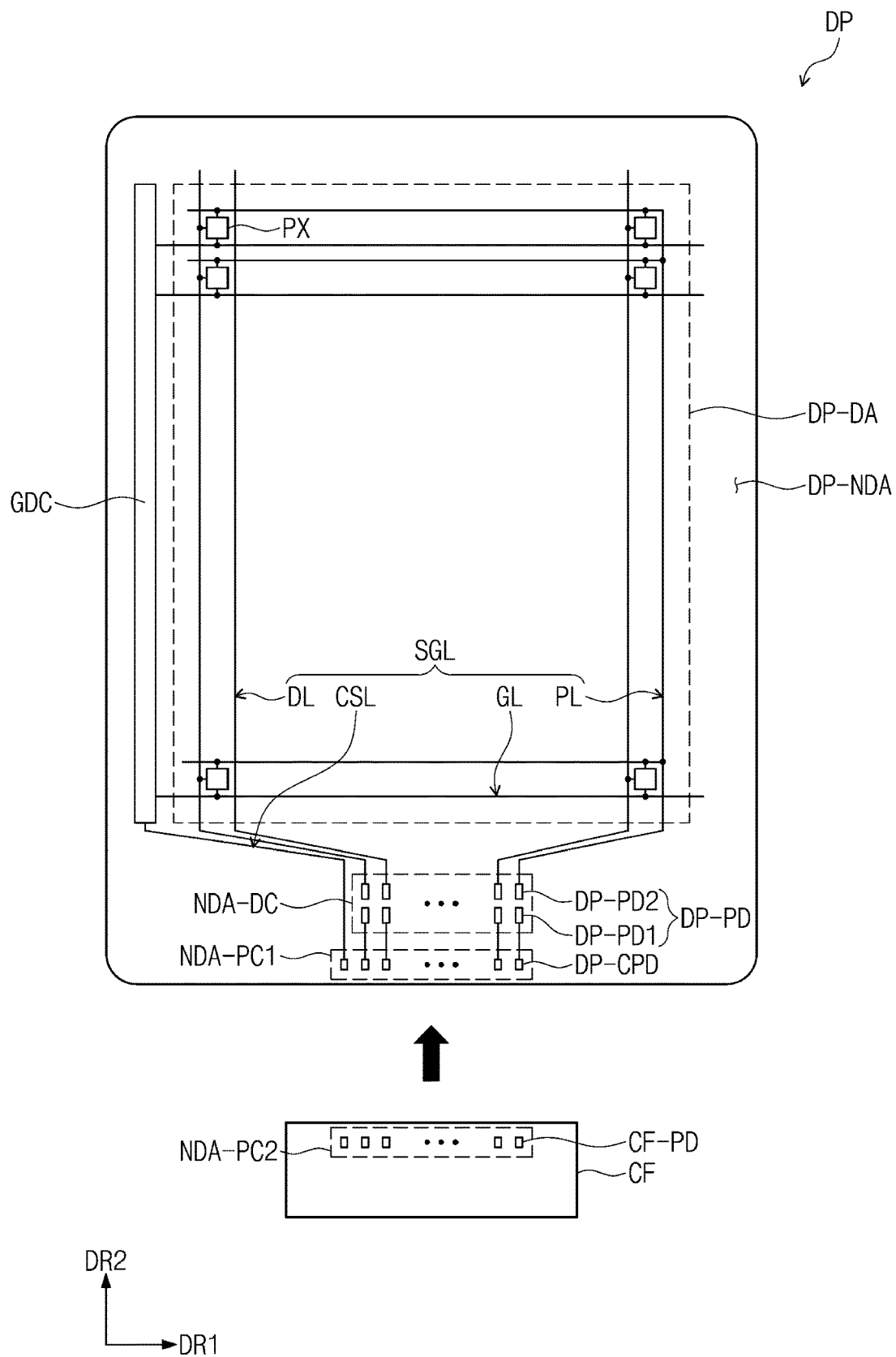
FIG. 3 is a plan view of the display panel and a circuit board of the display device of FIG. 1B.

FIG. 3 is a plan view of the display panel DP and the circuit board CF of the display device DD of FIG. 1B.

Referring to FIG. 3, the display panel DP may include a driving circuit GDC, a plurality of signal lines SGL, a plurality of first driving pads DP-PD, a plurality of second driving pads DP-CPD, and a plurality of pixels PX. The pixels PX may be arranged in the display area DP-DA. Each of the pixels PX may include the organic light emitting diode and the pixel driving circuit connected to the organic light emitting diode. The driving circuit GDC, the signal lines SGL, the first driving pads DP-PD, the second driving pads DP-CPD, and the pixel driving circuit may be included in the circuit element layer DP-CL shown in FIG. 2.

The driving circuit GDC sequentially outputs gate signals to gate lines GL. The driving circuit GDC further outputs another control signal to the pixels PX. The driving circuit GDC may include a plurality of thin film transistors formed through the same processes, e.g., a low temperature polycrystalline silicon (LTPS) process or a low temperature polycrystalline oxide (LTPO) process, as the transistor of the pixel driving circuit of the pixels PX.

The signal lines SGL include the gate lines GL, data lines DL, a power line PL, and a control signal line CSL. Each of the gate lines GL is connected to a corresponding pixel among the pixels PX, and each of the data lines DL is connected to a corresponding pixel among the pixels PX. The power line PL is connected to the pixels PX. The control signal line CSL provides the control signals to the driving circuit GDC.

The signal lines SGL overlap the display area DP-DA and the non-display area DP-NDA. Each of the signal lines SGL includes a pad portion and a line portion. The line portion overlaps the display area DP-DA and the non-display area DP-NDA. The pad portion is connected to an end of the line portion. The pad portion is disposed in the non-display area DP-NDA and overlaps a corresponding signal pad among the first driving pads DP-PD.

Hereinafter, an area in which the first driving pads DP-PD are arranged in the non-display area DP-NDA may be referred to as a chip area NDA-DC, and an area in which the second driving pads DP-CPD are arranged in the non-display area DP-NDA may be referred to as a first pad area NDA-PC1.

According to an embodiment, the driving chip DC shown in FIG. 1B may be mounted on the chip area NDA-DC. The first driving pads DP-PD may be electrically connected to the driving chip DC to transmit electrical signals provided from the driving chip DC to the signal lines SGL.

In detail, the first driving pads DP-PD include first-row driving pads DP-PD1 arranged in a first row along the first direction DR1 and second-row driving pads DP-PD2 arranged in a second row along the first direction DR1. However, embodiments are not limited thereto or thereby. For example, the first driving pads DP-PD may be arranged in one row or plural rows along the first direction DR1.

A portion of a circuit board CF may be disposed in the first pad area NDA-PC1. The second driving pads DP-CPD are electrically connected to the circuit board CF and receive electrical signals from the circuit board CF. The second driving pads DP-CPD transmit the electrical signals from the circuit board CF to the first driving pads DP-PD. The circuit board CF may be rigid or flexible. For example, when the circuit board CF is flexible, a flexible printed circuit board may be provided as the circuit board CF.

The circuit board CF may include a timing control circuit that controls an operation of the display panel DP. The timing control circuit may be mounted on the circuit board CF in the form of an integrated chip. In addition, the circuit board CF may include an input sensing circuit that controls the input sensing layer ISU.

The circuit board CF may include circuit pads CF-PD electrically connected to the display panel DP. The circuit pads CF-PD may be disposed in a second pad area NDA-PC2 defined in the circuit board CF.

In the illustrated embodiment, the display panel DP includes the first driving pads DP-PD on which the driving chip DC shown in FIG. 1B is mounted. However, embodiments are not limited thereto or thereby. The driving chip DC may be mounted on the circuit board CF, and in this case, the first driving pads DP-PD may be omitted.

Figure 4:
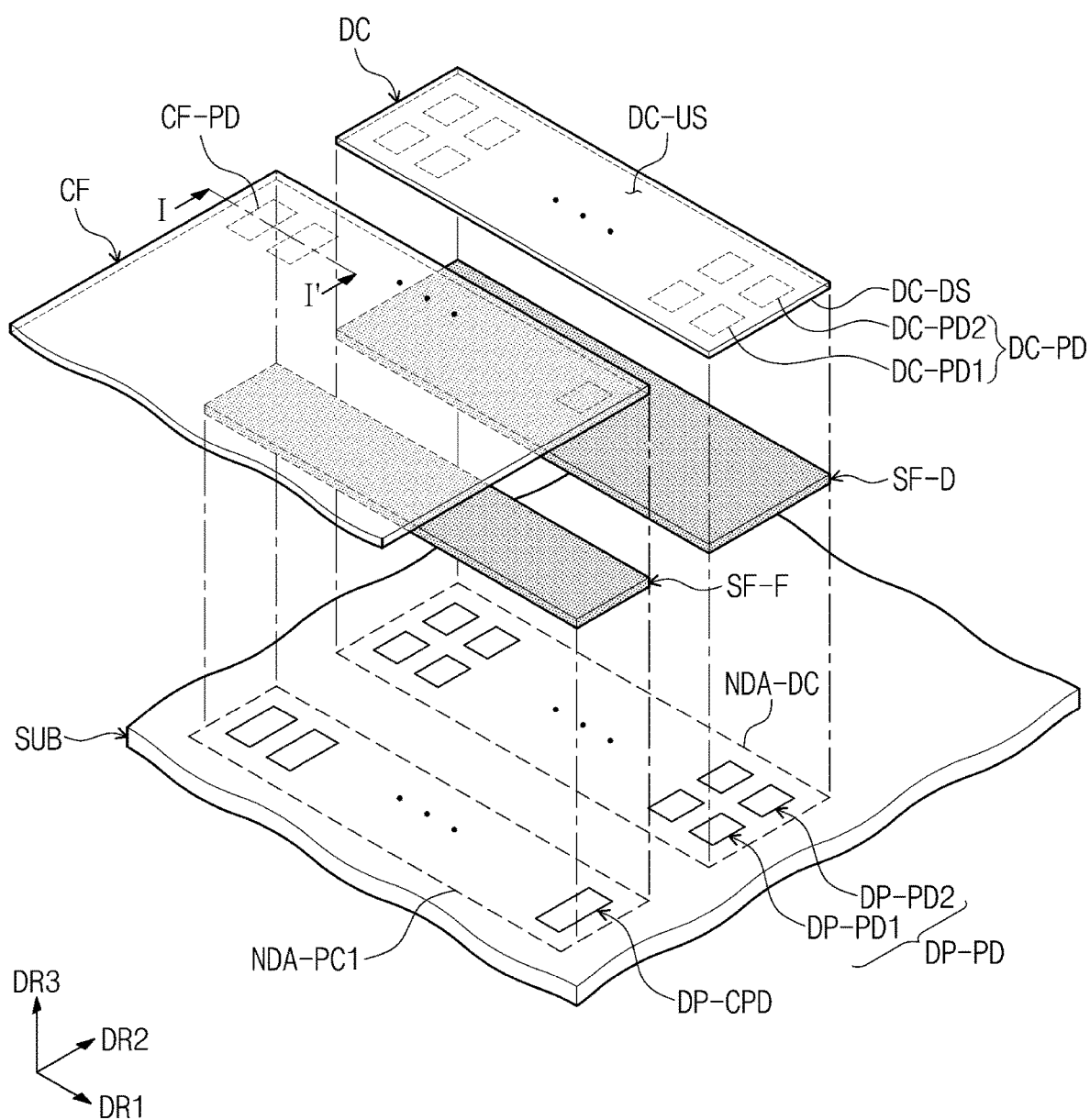
FIG. 4 is an exploded perspective view of a circuit board, a driving chip, and a driving pad of the display device of FIG. 1B.
Figure 5:
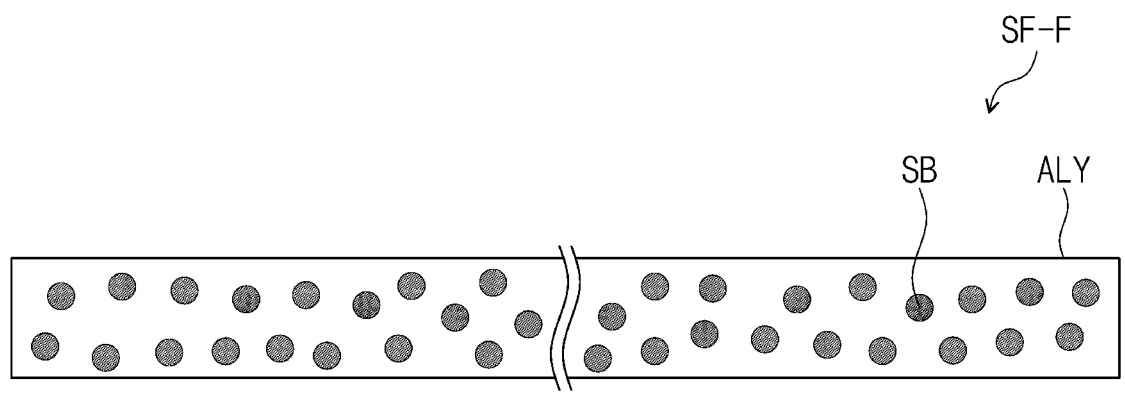
FIG. 5 is a cross-sectional view of an embodiment of a second adhesive conductive member of FIG. 4.

FIG. 4 is an exploded perspective view of a circuit board CF, a driving chip DC, and a first driving pad DP-PD and a second driving pad DP-CPD of the display device DD of FIG. 1B, and FIG. 5 is a cross-sectional view of an embodiment of a second conductive adhesive member SF-F of FIG. 4.

Referring to FIG. 4, the display device DD further includes conductive adhesive members SF-D and SF-F. The conductive adhesive members SF-D and SF-F include a first conductive adhesive member SF-D and a second conductive adhesive member SF-F.

As shown in FIG. 5, the second conductive adhesive member SF-F includes an adhesive layer ALY and a plurality of conductive particles SB formed in a solder and distributed in the adhesive layer ALY. The conductive particles SB are irregularly distributed in the adhesive layer ALY. The first conductive adhesive member SF-D has substantially the same configuration and structure as those of the second conductive adhesive member SF-F shown in FIG. 5.

Referring to FIG. 4 again, the first conductive adhesive member SF-D is disposed between the driving chip DC and the substrate SUB of the display panel DP and electrically connects the driving chip DC to the display panel DP. The second conductive adhesive member SF-F is disposed between the circuit board CF and the substrate SUB of the display panel DP and electrically connects the circuit board CF to the display panel DP.

The driving chip DC includes an upper surface DC-US and a lower surface DC-DS. The lower surface DC-DS of the driving chip DC faces the display panel DP. The driving chip DC includes connection pads DC-PD electrically connected to the first driving pads DP-PD disposed on the substrate SUB, respectively. The connection pads DC-PD include first-row connection pads DC-PD1 arranged in a first row along the first direction DR1 and second-row connection pads DC-PD2 arranged in a second row along the first direction DR1. The first-row connection pads DC-PD1 and the second-row connection pads DC-PD2 are exposed from the lower surface DC-DS of the driving chip DC to the outside. In the illustrated embodiment, the connection pads DC-PD are arranged in two rows. However, in other embodiments, the connection pads DC-PD may be arranged in a single row or multiple rows corresponding to the arrangement of the first driving pads DP-PD.

According to the illustrated embodiment, the first conductive adhesive member SF-D is sequentially first bonded to one component of the driving chip DC and the substrate SUB of the display panel DP, and then is bonded to the remaining component of the driving chip DC and the substrate SUB of the display panel DP. For instance, an upper surface of the first conductive adhesive member SF-D, which faces the driving chip DC, is first bonded to the connection pads DC-PD of the driving chip DC, and then, the first driving pads DP-PD of the display panel DP are bonded to a lower surface of the first conductive adhesive member SF-D.

In particular, in the case where the first conductive adhesive member SF-D is bonded to the driving chip DC, the conductive particles SB included in the first conductive adhesive member SF-D are aligned on the connection pads DC-PD. As shown in FIG. 5, the conductive particles SB are irregularly distributed in the adhesive layer ALY before the first conductive adhesive member SF-D is bonded to the driving chip DC.

According to the illustrated embodiment, as the first conductive adhesive member SF-D is disposed on the lower surface DC-DS of the driving chip DC, the conductive particles SB formed in the solder are aligned on the connection pads DC-PD by an affinity property, such as the connection pads DC-PD having hydrophilicity. Manufacture of electrical components, such as connection pads DC-PD, with hydrophilic properties is well known in the art. The interfacial contact property between the conductive particles SB comprising the solder and the connection pads DC-PD is better as hydrophilic property of the connection pads DC-PD is greater. As a result, the conductive particles SB overlap the connection pads DC-PD and do not overlap the space between two adjacent connection pads DC-PD. Accordingly, the likelihood of short circuit between two adjacent connection pads DC-PD may be reduced or prevented due to alignment of the conductive particles SB by affinity, such as hydrophilicity.

In addition, as the first conductive adhesive member SF-D is first bonded to the driving chip DC, whether the conductive particles SB are aligned on the connection pads DC-PD may be more easily checked. For instance, in a case where the substrate SUB and the driving chip DC are substantially simultaneously bonded to the first conductive adhesive member SF-D, it is difficult to check whether the conductive particles SB are aligned on the connection pads DC-PD.

The circuit pads CF-PD included in the circuit board CF are electrically connected to the second driving pads DP-CPD, respectively. The circuit pads CF-PD are exposed to the outside from the lower surface of the circuit board CF.

An upper surface of the second conductive adhesive member SF-F is in contact with the circuit pads CF-PD of the circuit board CF, and a lower surface of the second conductive adhesive member SF-F is in contact with the second driving pads DP-CPD.

According to the illustrated embodiment, the second conductive adhesive member SF-F is sequentially first bonded to one component of the circuit board CF and the substrate SUB of the display panel DP, and then is bonded to the remaining component of the circuit board CF and the substrate SUB of the display panel DP. For instance, the upper surface of the second conductive adhesive member SF-F, which faces the circuit board CF, is first bonded to the circuit pads CF-PD of the circuit board CF, and then, the second driving pads DP-CPD of the display panel DP are bonded to the lower surface of the second conductive adhesive member SF-F.

In particular, in the case where the second conductive adhesive member SF-F is bonded to the circuit board CF, the conductive particles SB included in the second conductive adhesive member SF-F are aligned on the circuit pads CF-PD. Similar to the first conductive adhesive member SF-D, the conductive particles SB are irregularly distributed in the adhesive layer ALY before the second conductive adhesive member SF-F is bonded to the circuit board CF.

According to the illustrated embodiment, as the second conductive adhesive member SF-F is disposed on the lower surface of the circuit board CF, the conductive particles SB formed in the solder are aligned on the circuit pads CF-PD by the circuit pads CF-PD having hydrophilicity. The interfacial contact property between the conductive particles SB comprising the solder and the circuit pads CF-PD is better as hydrophilic property of the circuit pads CF-PD is greater. As a result, the conductive particles SB overlap the circuit pads CF-PD and do not overlap the space between two adjacent circuit pads CF-PD. Accordingly, the likelihood of a short circuit between two circuit pads CF-PD adjacent to each other may be reduced or prevented.

In addition, as the second conductive adhesive member SF-F is first bonded to the circuit board CF, whether the conductive particles SB are aligned on the connection pads DC-PD may be more easily checked.

As described with reference to FIG. 4, the conductive adhesive members SF-D and SF-F are bonded to the display panel DP after being bonded to the driving chip DC and the circuit board CF, respectively. However, embodiments are not limited thereto or thereby. For instance, similar to the process described with reference to FIG. 4, the conductive adhesive members SF-D and SF-F may be bonded to the driving chip DC and the circuit board CF, respectively, after being bonded to the display panel DP.

Figure 6:
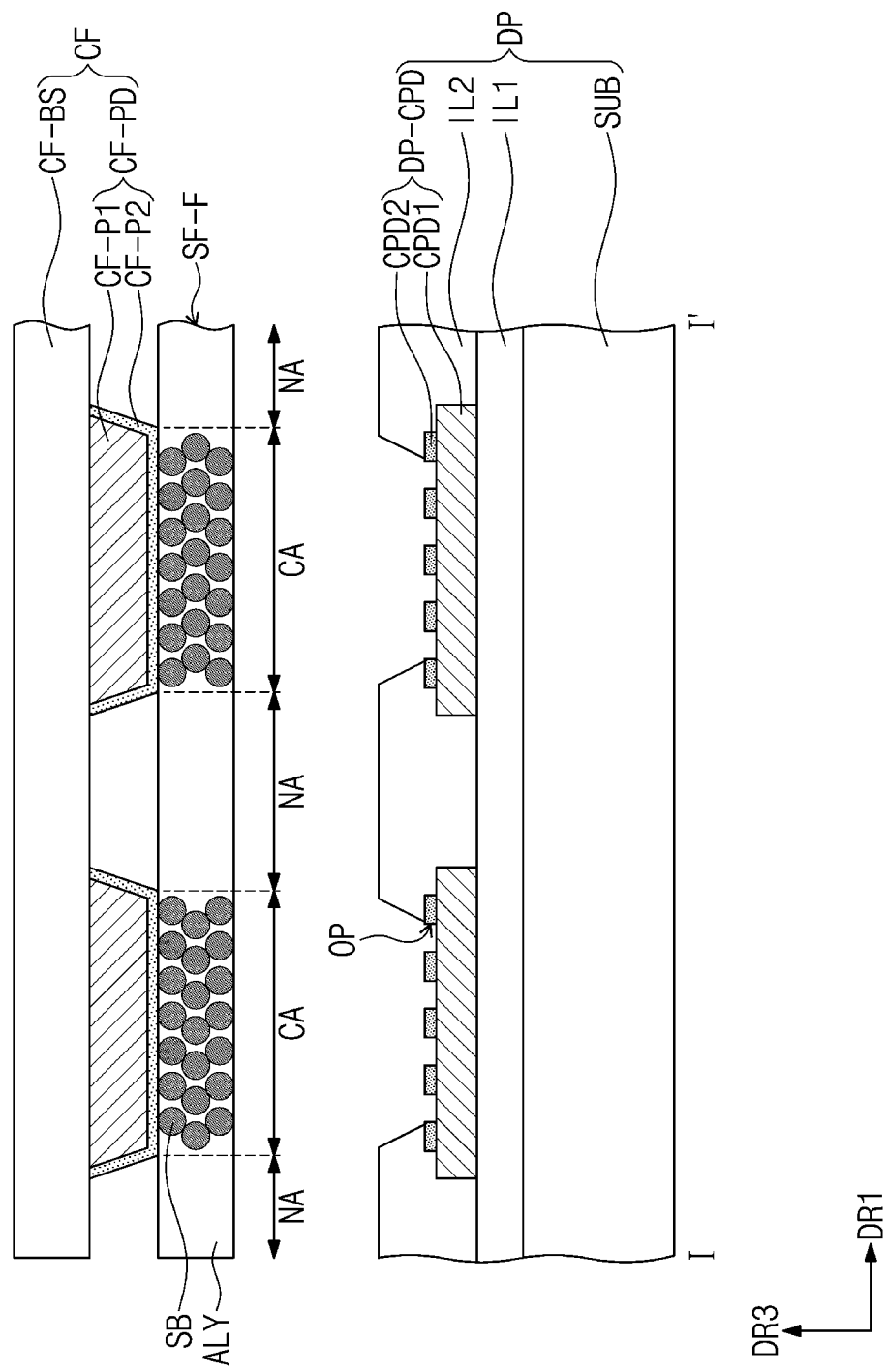
FIG. 6 is a cross-sectional exploded view taken along a line I-I' of FIG. 4.
Figure 7:
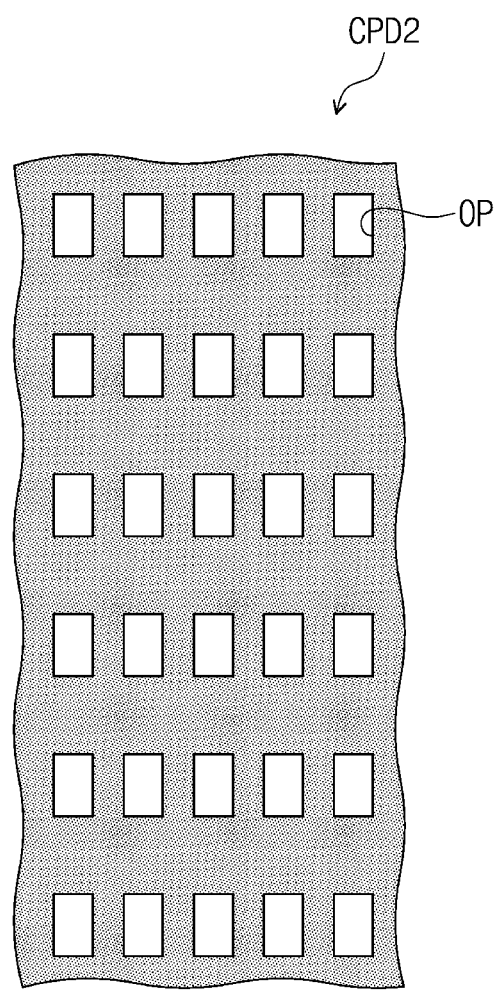
FIG. 7 is a plan view of an embodiment of a second pad of the driving pads of the display panel of FIG. 6.
Figure 8A:
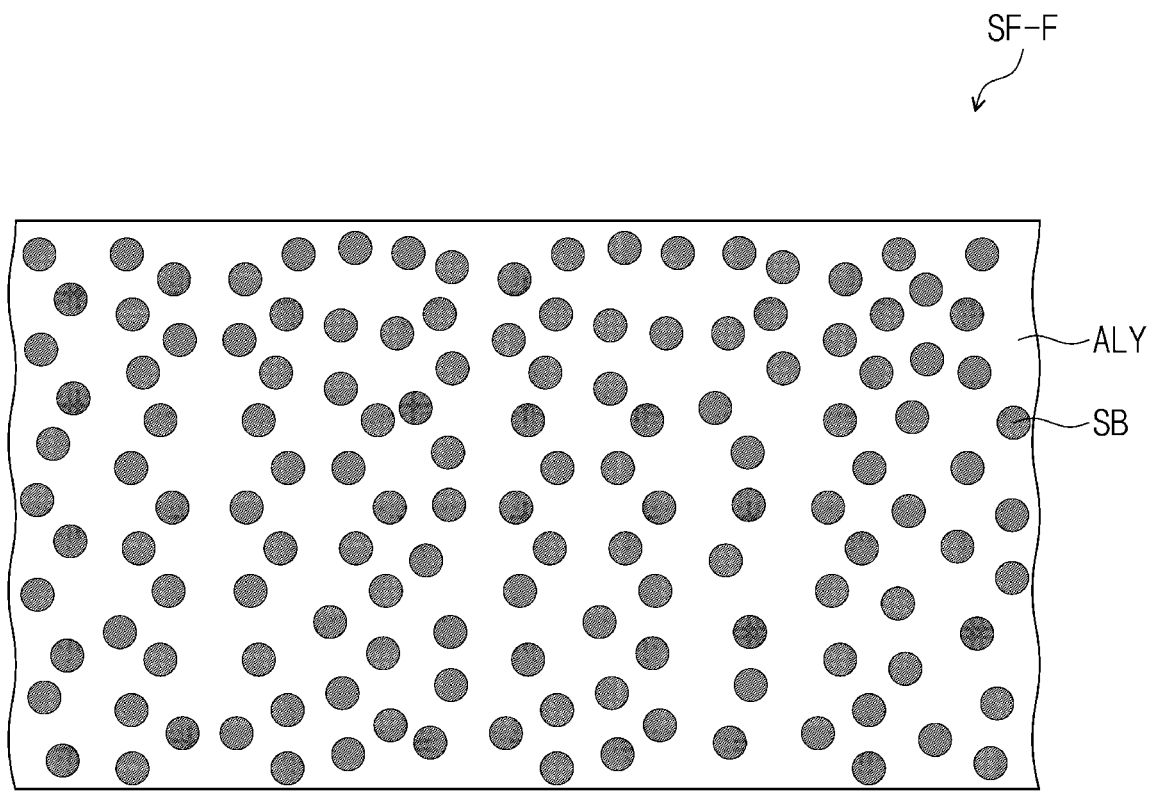
FIG. 8A is a plan view of an embodiment of a second conductive adhesive member before conductive particles are aligned.
Figure 8B:
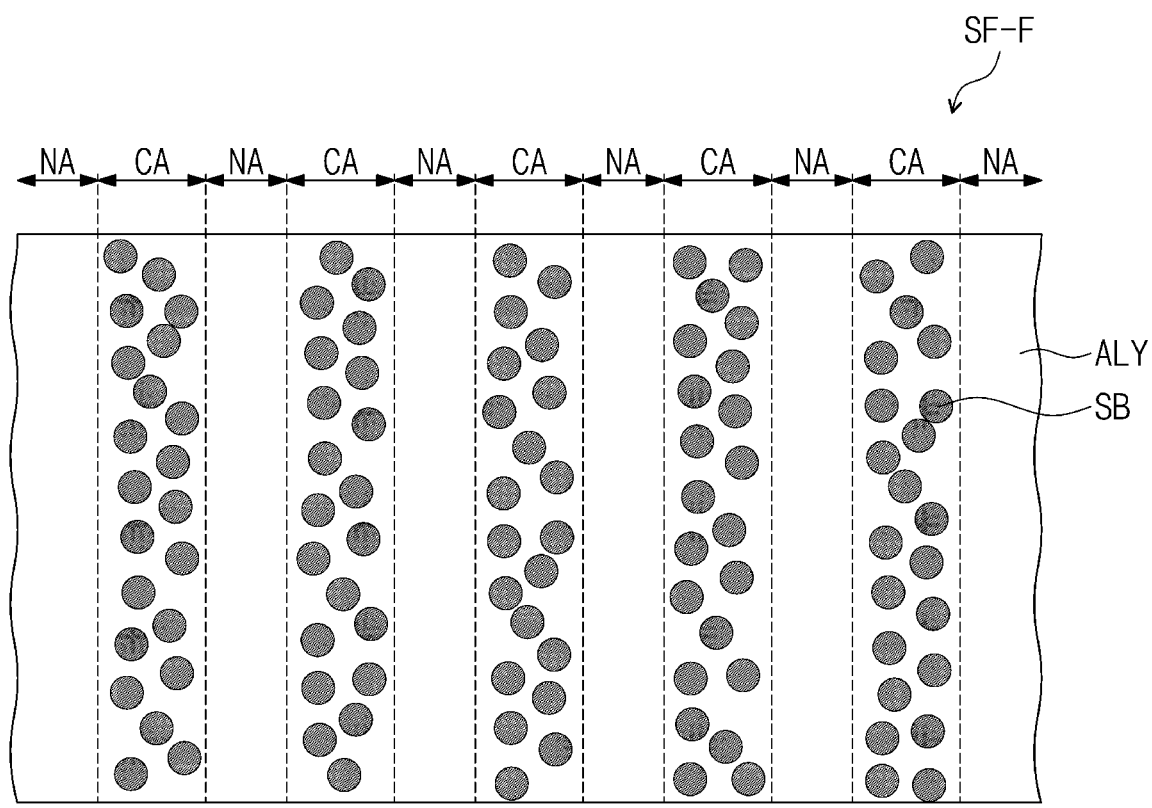
FIG. 8B is a plan view of the second conductive adhesive member of FIG. 8A after conductive particles are aligned.
Figure 9:
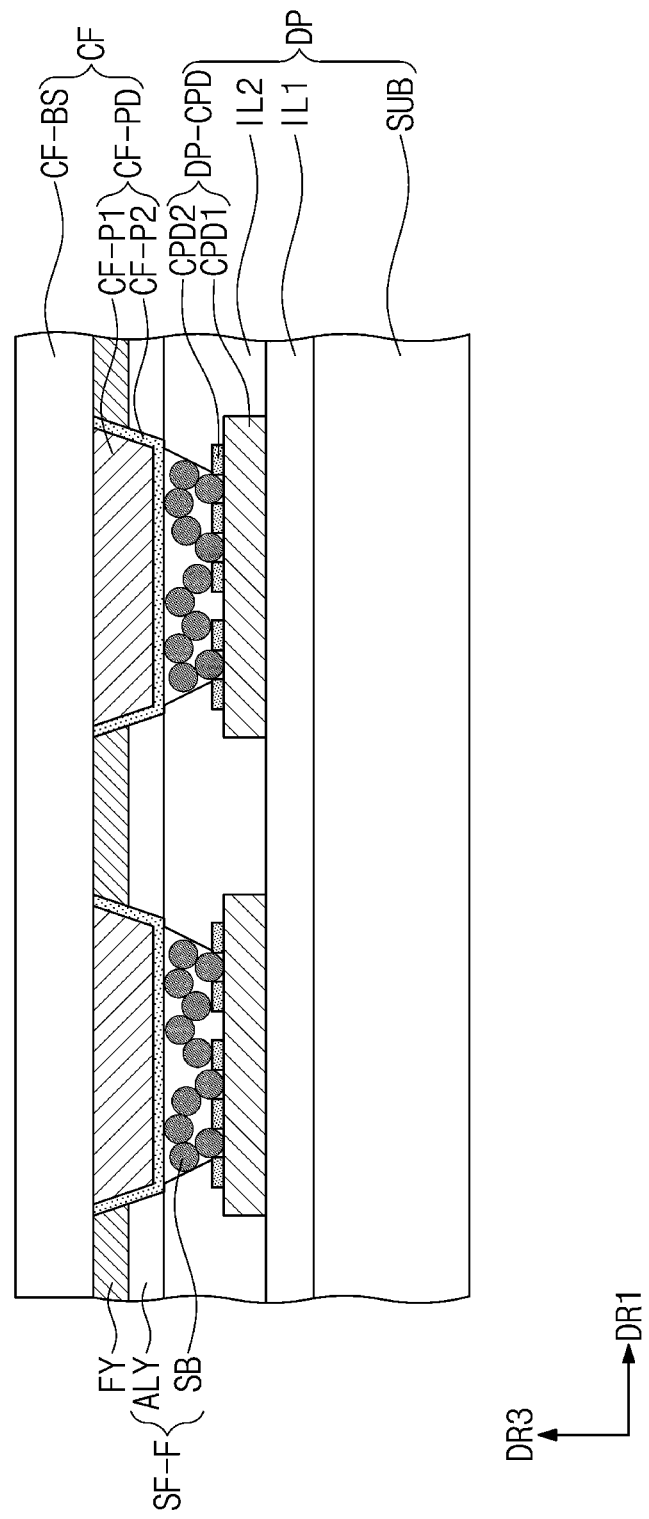
FIG. 9 is a cross-sectional view of an embodiment of a connection between the display panel and the circuit board of the display device of FIG. 1B.

FIG. 6 is a cross-sectional exploded view taken along a line I-I' of FIG. 4. FIG. 7 is a plan view of an embodiment of a second pad CPD2 among the second driving pads DP-CPD of a display panel DP of FIG. 6. FIG. 8A is a plan view of an embodiment of the second conductive adhesive member SF-F before the conductive particles SB are aligned. FIG. 8B is a plan view of the second conductive adhesive member SF-F after the conductive particles SB are aligned. FIG. 9 is a cross-sectional view of an embodiment of a connection between the display panel and the circuit board of the display device of FIG. 1B.

Hereinafter, the process of bonding the circuit board CF to the display panel DP using the second conductive adhesive member SF-F shown in FIG. 4 will be described with reference to FIGS. 6, 7, 8, and 9. The process of bonding the driving chip DC to the display panel DP using the first conductive adhesive member SF-D may be substantially the same as the process described with reference to FIGS. 6, 7, 8, and 9.

Referring to FIG. 6, the display panel DP includes the substrate SUB described with reference to FIG. 2, insulating layers IL1 and IL2 disposed on the substrate SUB, and the second driving pads DP-CPD (hereinafter, referred to as driving pads).

According to the illustrated embodiment, at least one insulating layer is disposed between the driving pads DP-CPD and the substrate SUB, and as an example, a first insulating layer IL1 and a second insulating layer IL2, which are stacked on the substrate SUB, are shown in FIG. 6. The driving pads DP-CPD are disposed on the first insulating layer IL1. The second insulating layer IL2 exposes the driving pads DP-CPD to the outside and is disposed on the first insulating layer IL1.

The driving pads DP-CPD include first pads CPD1 disposed on the first insulating layer IL1 and second pads CPD2 disposed on the first pads CPD1. The first pads CPD1 are electrically in contact with the second pads CPD2. The driving pads DP-CPD are electrically connected to the circuit pads CF-PD through the second conductive adhesive member SF-F (hereinafter, referred to as "conductive adhesive member"). As a result, electrical signals output through the circuit pads CF-PD are applied to the driving pads DP-CPD through the conductive adhesive member.

According to the illustrated embodiment, the first pads CPD1 and the second pads CPD2 include different materials from each other. For example, the first pads CPD1 include a metal material, and the second pads CPD2 include a transparent conductive layer. The transparent conductive layer includes indium tin oxide (ITO), indium zinc oxide (IZO), zinc oxide (ZnO), indium tin zinc oxide (ITZO), PEDOT, metal nanowire, graphene, or the like. The metal material includes molybdenum, silver, titanium, copper, aluminum, and alloys thereof.

In particular, the second pads CPD2 are provided with at least one opening OP through which the first pads CPD1 are exposed. FIG. 7 shows the second pads CPD2 when viewed in plan. The second pads CPD2 define a plurality of openings OP, and the first pads CPD1 are exposed through the openings OP. As another example, the second pads CPD2 may have a mesh structure, and the openings OP are defined by the mesh structure.

The openings OP may be provided through the second pads CPD2 to expose the first pads CPD1. Because electrical bonding characteristics between the first pads CPD1 formed of the metal material and the conductive particles SB formed in the solder are better than those between the second pads CPD2 that is the transparent conductive layer and the conductive particles SB, as the conductive particles SB are in contact with the first pads CPD1 through the openings OP defined through the second pads CPD2, the electrical connection characteristics between the driving pads DP-CPD and the circuit pads CF-PD are improved.

The circuit board CF includes a base layer CF-BS and the circuit pads CF-PD. An insulating layer is further disposed on the base layer CF-BS. As an example, the insulating layer is disposed between the base layer CF-BS and the circuit pads CF-PD.

The circuit pads CF-PD includes a first circuit pad CF-P1 disposed on the base layer CF-BS and a second circuit pad CF-P2 covering the first circuit pad CF-P1 and disposed on the base layer CF-BS. The second circuit pad CF-P2 has a smaller thickness than that of the first circuit pad CF-P1. In the illustrated embodiment, the first circuit pad CF-P1 includes copper (Cu), and the second circuit pad CF-P2 includes tin (Sn). The second circuit pad CF-P2 may prevent the first circuit pad CF-P1 including copper (Cu) from being oxidized with air.

According to the illustrated embodiment, the conductive adhesive member SF-F is first bonded to the circuit pads CF-PD of the circuit board CF. As shown in FIG. 6, the conductive particles SB included in the conductive adhesive member SF-F are aligned on the circuit pads CF-PD by the circuit pads CF-PD, which have hydrophilicity to attract the conductive particles SB.

In detail, referring to FIG. 8A, the conductive particles SB distributed in the adhesive layer ALY are in an unaligned state. For example, the conductive particles SB are provided to overlap an area in which the conductive particles SB are bonded to the circuit pads CF-PD and an area in which the conductive particles SB are not bonded to the circuit pads CF-PD.

Referring to FIG. 8B, the adhesive layer ALY includes a bonding area CA that overlaps the circuit pads CF-PD and a non-bonding area NA that is adjacent to the bonding area CA and does not overlap the circuit pads CF-PD. As the conductive adhesive member SF-F is first bonded to the circuit pads CF-PD, the conductive particles SB irregularly distributed in the adhesive layer ALY move to the bonding areas CA.

As described above, the conductive particles SB formed in the solder are self-aligned in the bonding area CA due to the hydrophilicity of the circuit pads CF-PD. As a result, as shown in FIG. 8B, the conductive particles SB are aligned on the bonding areas CA that overlaps the circuit pads CF-PD.

Referring to FIG. 6 again, as the conductive adhesive member SF-F is bonded to the circuit board CF, the conductive particles SB are aligned to overlap the circuit pads CF-PD. In this case, the conductive particles SB are directly in contact with the second circuit pad CF-P2 and do not overlap the space between the circuit pads CF-PD. However, a small amount of conductive particles SB may overlap the space between the circuit pads CF-PD, but this is due to process errors.

Referring to FIG. 9, the conductive adhesive member SF-F is bonded between the circuit board CF and the display panel DP. According to the illustrated embodiment, as the conductive particles SB are aligned on the circuit pads CF-PD, the conductive particles SB are easily bonded to the driving pads DP-CPD of the display panel DP.

In detail, the circuit board CF and the display panel DP are aligned so that the aligned conductive particles SB face the driving pads DP-CPD. In this case, the conductive particles SB are disposed between the driving pads DP-CPD and the circuit pads CF-PD and do not overlap the space between the driving pads DP-CPD and between the circuit pads CF-PD. Then, the circuit board CF or the display panel DP is pressed, and thus, the conductive particles SB are bonded to the driving pads DP-CPD.

As shown in FIG. 9, in the process of bonding the circuit board CF to the display panel DP, the conductive particles SB may be in contact with not only the second pad CPD2 but also the first pad CPD1 through the openings OP (refer to FIG. 7) defined by the second pads CPD2. As a result, the circuit pads CF-PD and the driving pads DP-CPD are electrically connected to each other through the conductive particles SB.

In addition, after the bonding process between the circuit board CF and the display panel DP is completed using the conductive adhesive member SF-F, a filling agent FY is provided between the base layer CF-BS of the circuit board CF and the conductive adhesive member SF-F. As an example, the filling agent FY includes a photo-initiator. The filling agent FY including the photo-initiator is cured by an external ultraviolet light. As another example, the filling agent FY includes a heat-initiator, and in this case, the filling agent FY including the heat-initiator is cured by an external heat.

The filling agent FY is filled in an inner space between the circuit board CF and the conductive adhesive member SF-F, the display panel DP and the circuit board CF may be more firmly bonded.

As described with reference to FIGS. 6, 7, 8, and 9, the conductive particles SB are aligned on the circuit pads CF-PD during the bonding process in which the conductive adhesive member SF-F is first bonded to the circuit board CF. Through this, whether the conductive particles SB are aligned on the circuit pads CF-PD may be easily checked. For instance, it may be easy to check the case where the conductive particles SB overlap the non-bonding area NA that does not overlap the circuit pads CF-PD. As a result, the process time required to bond the display panel DP to the circuit board CF through the conductive adhesive member SF-F may be reduced overall.

As the process of bonding the driving pads DP-CPD of the display panel DP and the conductive particles SB aligned in the bonding area CA is performed, the conductive particles SB are easily bonded on the driving pads DP-CPD. Accordingly, the conductive particles SB do not overlap the space between the circuit pads CF-PD or the space between the driving pads DP-CPD, and thus, the short circuit between the circuit pads CF-DP or between the driving pads DP-CPD may be prevented.

Figure 10:
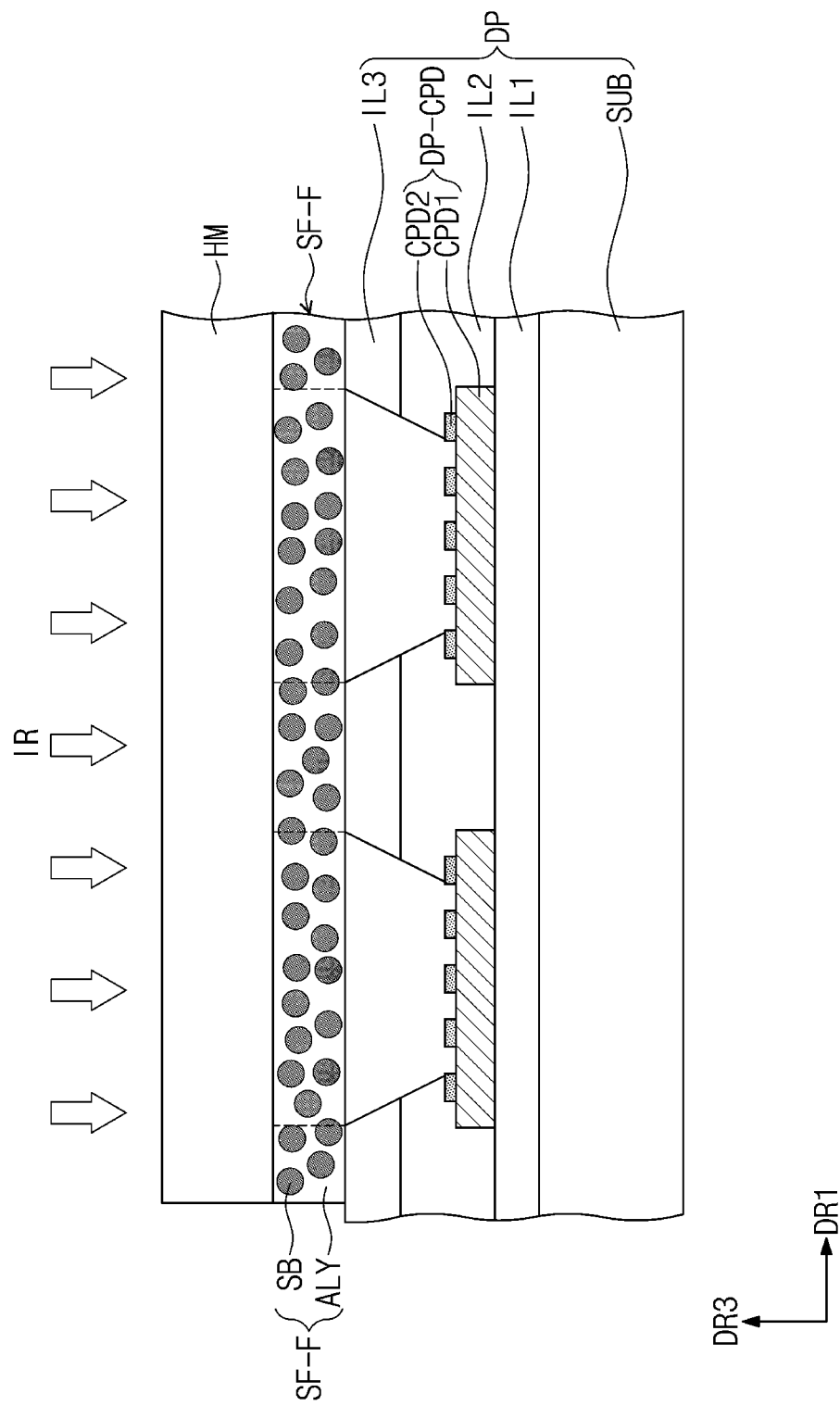
FIG. 10 is a cross-sectional view of an embodiment of a second conductive adhesive member before conductive particles are aligned and a display panel.
Figure 11:
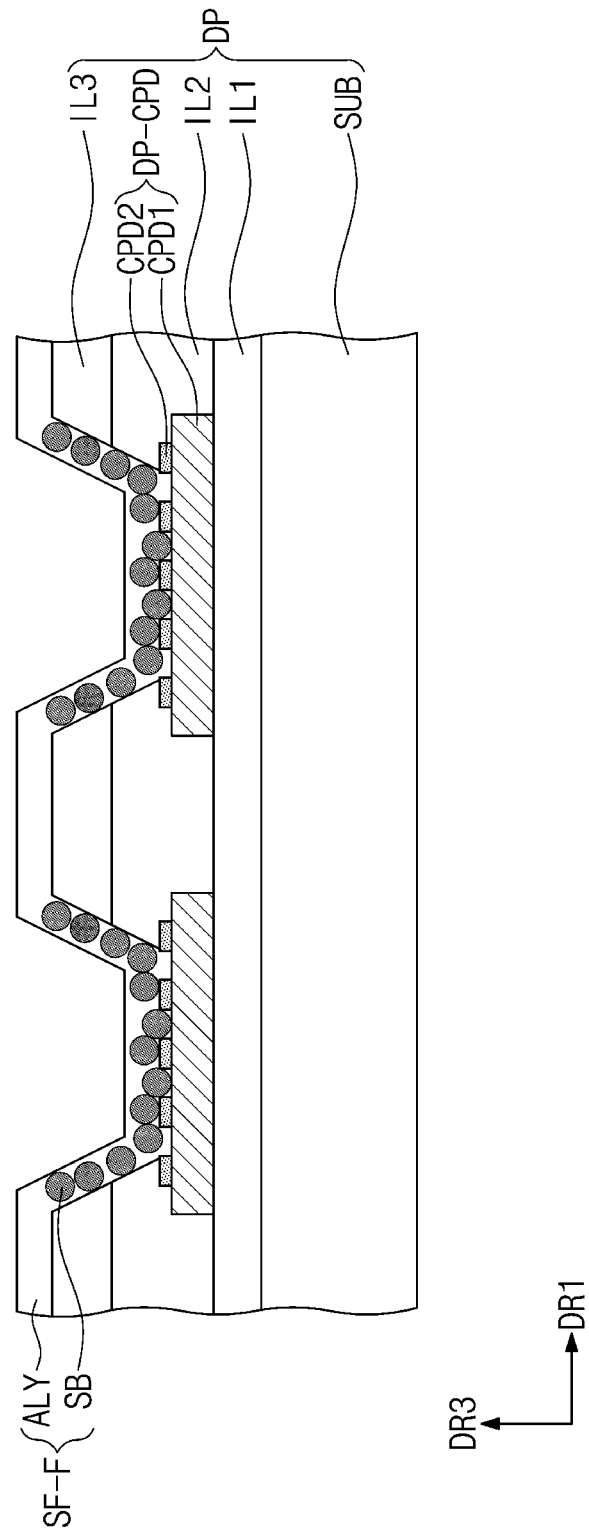
FIG. 11 is a cross-sectional view of another embodiment of a second conductive adhesive member after conductive particles aligned and a display panel.
Figure 12:
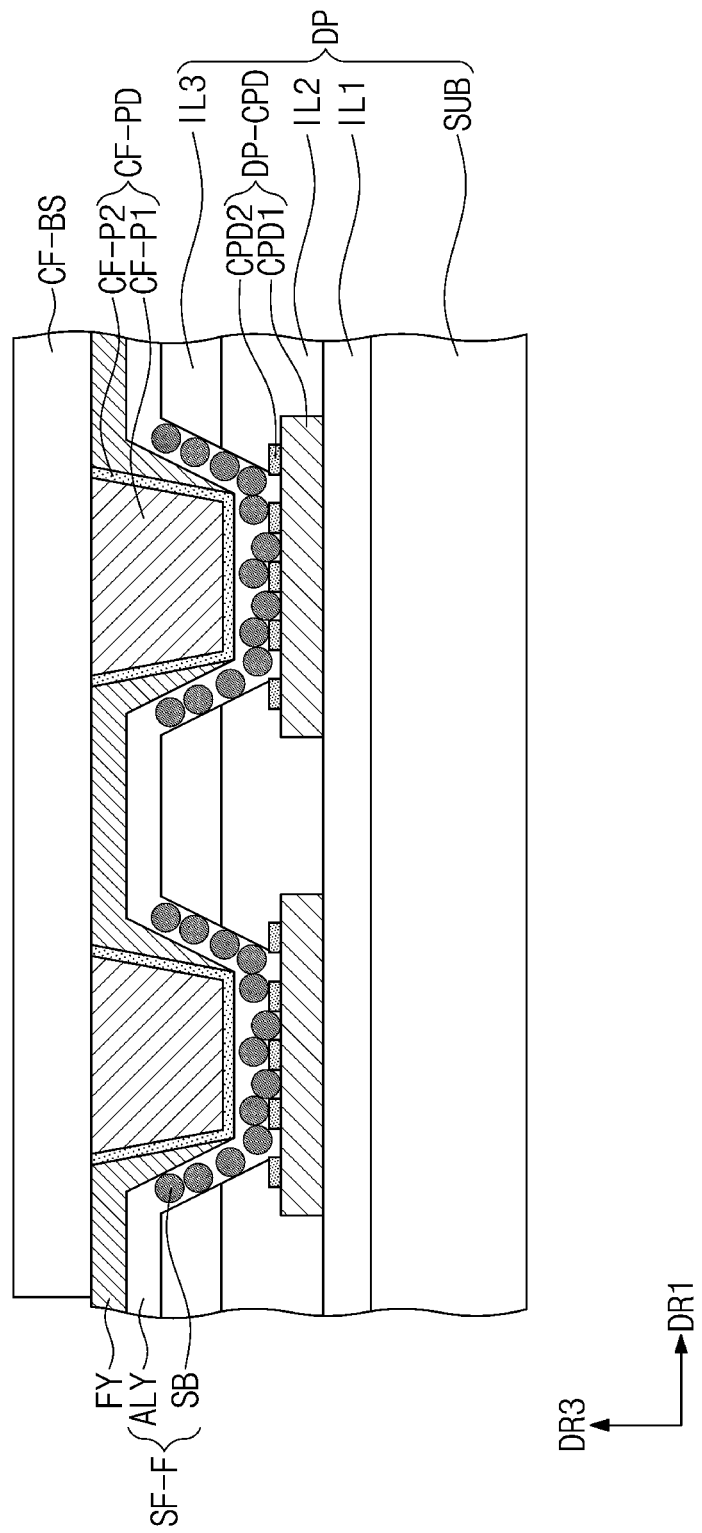
FIG. 12 is a cross-sectional view of another embodiment of a connection between the display panel and the circuit board of the display device of FIG. 1B.

FIG. 10 is a cross-sectional view of an embodiment of a second conductive adhesive member before the conductive particles are aligned and a display panel. FIG. 11 is a cross-sectional view of another embodiment of the second conductive adhesive member after the conductive particles are aligned and the display panel. FIG. 12 is a cross-sectional view of another embodiment of a connection between the display panel and the circuit board of the display device of FIG. 1B.

The display panel DP shown in FIG. 10 further includes a third insulating layer IL3 disposed on a second insulating layer IL2 when compared with the display panel DP shown in FIG. 6. The third insulating layer IL3 exposes driving pads DP-CPD to the outside, is disposed on the second insulating layer IL2, and is an organic layer. The third insulating layer IL3 may be referred to as an auxiliary insulating layer.

Hereinafter, a process of bonding a conductive adhesive member SF-F to a circuit board CF after the conductive adhesive member SF-F is first bonded to the display panel DP will be described with reference to FIGS. 10, 11 and 12.

Referring to FIG. 10, the conduction adhesive member SF-F is first bonded to the display panel DP. In this case, the conduction adhesive member SF-F is disposed on the third insulating layer IL3, and conductive particles SB are not aligned.

According to the illustrated embodiment, a structure HM is disposed on the conduction adhesive member SF-F and presses the conduction adhesive member SF-F. For example, the structure HM is a sapphire or quartz member that is transparent.

Then, an external infrared laser IR is irradiated to the conductive adhesive member SF-F through the structure HM disposed on the conductive adhesive member SF-F.

According to the embodiment, the conductive particles SB irregularly distributed in an adhesive layer ALY are formed in solder and are aligned on the driving pads DP-CPD by a heat applied thereto by the external infrared laser IR. As a result, as shown in FIG. 11, the conductive particles SB are aligned on the driving pads DP-CPD. That is, the conductive particles SB overlap the driving pads DP-CPD.

In particular, an area overlapping the driving pads DP-CPD corresponds to a space that is recessed from the third insulating layer IL3 due to the second and third insulating layers IL2 and IL3. For example, the conductive particles SB disposed on each driving pad are aligned in the recessed space by the second and third insulating layers IL2 and IL3. As a result, the likelihood of a short circuit between the conductive particles SB aligned on one driving pad and the conductive particles SB aligned on another driving pad adjacent to the one driving pad among the driving pads DP-CPD may be reduced or prevented.

Referring to FIG. 12, the circuit board CF is bonded to the conductive adhesive member SF-F after the conductive adhesive member SF-F is bonded to the driving pads DP-CPD of the display panel DP. In this case, the conductive particles SB are in a state of being aligned on the driving pads DP-CPD. As a result, circuit pads CF-PD of the circuit board CF are bonded to the conductive particles SB after being aligned to face the driving pads DP-CPD. Then, a filling agent FY is filled between the conductive adhesive member SF-F and the base layer CF-BS.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a driving pad disposed on the substrate;
an insulating layer exposing the driving pad and disposed on the substrate;
a circuit board including a circuit pad overlapping the driving pad; and
a connector disposed between the circuit board and the insulating layer and comprising a plurality of conductive particles electrically connecting the driving pad and the circuit pad,
wherein the driving pad comprising:
a first pad disposed on the substrate; and
a second pad disposed on the first pad and having a thickness with plurality of openings therein extending through the thickness of the second pad, said plurality of openings exposing the first pad, and
wherein the insulating layer covers at least part of the second pad without covering the plurality of openings.

2. The display device of claim 1, wherein at least one of the plurality of conductive particles is in contact with the first pad through the plurality of openings.

3. The display device of claim 1, wherein:
the connector comprises a conductive adhesive member, and
the plurality of conductive particles comprise a solder.

4. The display device of claim 3, wherein the first pad and the second pad comprise different materials.

5. The display device of claim 4, wherein:
the first pad is formed of a metal, and
the second pad is formed of a transparent conductive layer.

6. The display device of claim 1, wherein the connector comprises a conductive adhesive member including an adhesive layer, and
wherein the adhesive layer has a bonding area overlapping the driving pad and a non-bonding area adjacent to the bonding area and not overlapping the driving pad.

7. The display device of claim 6, wherein the plurality of conductive particles are disposed between the driving pad and the circuit pad.

8. The display device of claim 6, wherein the plurality of conductive particles do not overlap the non-bonding area.

9. The display device of claim 6, further comprising a filling agent disposed between the adhesive layer and the circuit board.

10. The display device of claim 6, wherein the circuit board further comprises a base layer supporting the circuit pad, and the circuit pad comprises:
a first circuit pad disposed on the base layer; and
a second circuit pad covering the first circuit pad and disposed on the base layer.

11. The display device of claim 10, wherein the second circuit pad has a thickness smaller than a thickness of the first circuit pad, and the plurality of conductive particles are in contact with the second circuit pad.

12. The display device of claim 6, further comprising an auxiliary insulating layer exposing the driving pad and being disposed on the insulating layer,
wherein the adhesive layer is disposed between the auxiliary insulating layer and the circuit board.

13. The display device of claim 12, further comprising a filling agent disposed between the adhesive layer and the circuit board.

\* \* \* \* \*